United States Patent [19]
Roesner

[11] Patent Number: 5,938,050
[45] Date of Patent: Aug. 17, 1999

[54] GUIDE RAIL HAVING SIMILARLY SIZED RIBS AND SHOULDER

[75] Inventor: Arlen L. Roesner, Fort Collins, Colo.

[73] Assignee: Hewlett-Packard CO., Palo Alto, Calif.

[21] Appl. No.: 08/601,599

[22] Filed: Feb. 14, 1996

[51] Int. Cl.[6] .............................. A47H 1/00; A47F 5/00; E04B 2/00; E04B 2/08
[52] U.S. Cl. .......................... 211/94; 211/162; 52/287.1; 52/588.1
[58] Field of Search .............................. 211/26, 175, 183, 211/162, 94; 52/287.1, 586.1, 588.1

[56] References Cited

U.S. PATENT DOCUMENTS

| | | | |
|---|---|---|---|
| 2,732,706 | 1/1956 | Friedman | 52/586.1 |
| 3,190,020 | 6/1965 | Solari | 211/183 |
| 3,363,383 | 1/1968 | La Barge | 52/287.1 |
| 4,907,706 | 3/1990 | Henderson | 211/162 |
| 4,982,851 | 1/1991 | Konstant | 211/162 |
| 5,178,288 | 1/1993 | Weiner et al. | 211/162 |
| 5,207,336 | 5/1993 | Tyler | 211/162 |
| 5,224,610 | 7/1993 | Veazey | 211/162 |
| 5,267,658 | 12/1993 | Schwenk et al. | 211/26 |
| 5,348,778 | 9/1994 | Knipp et al. | 52/588.1 |
| 5,417,020 | 5/1995 | Dobija | 52/287.1 |
| 5,485,934 | 1/1996 | Holztrager | 211/162 |
| 5,501,047 | 3/1996 | Delaunay et al. | 52/287.1 |
| 5,579,924 | 12/1996 | Sands et al. | 211/26 |
| 5,592,794 | 1/1997 | Tundaun | 52/586.1 |

FOREIGN PATENT DOCUMENTS

| | | | |
|---|---|---|---|
| 1517992 | 3/1968 | France | 211/26 |

*Primary Examiner*—Tamara L. Graysay
*Assistant Examiner*—Matthew A. Kaness

[57] ABSTRACT

A guide rail may comprise a pair of ribs and a shoulder projecting outwardly therefrom, the shoulder terminating in a tip section, the pair of ribs being positioned in substantially parallel, spaced-apart relation so that a channel is defined between the ribs and so that the shoulder is positioned adjacent one of the ribs. Each rib has a substantially identical height and thickness. The channel has a width about equal to the thickness of the ribs and a depth about equal to the height of the ribs. The shoulder has a height about equal to the height of the ribs and a thickness about equal to the thickness of the ribs.

19 Claims, 3 Drawing Sheets

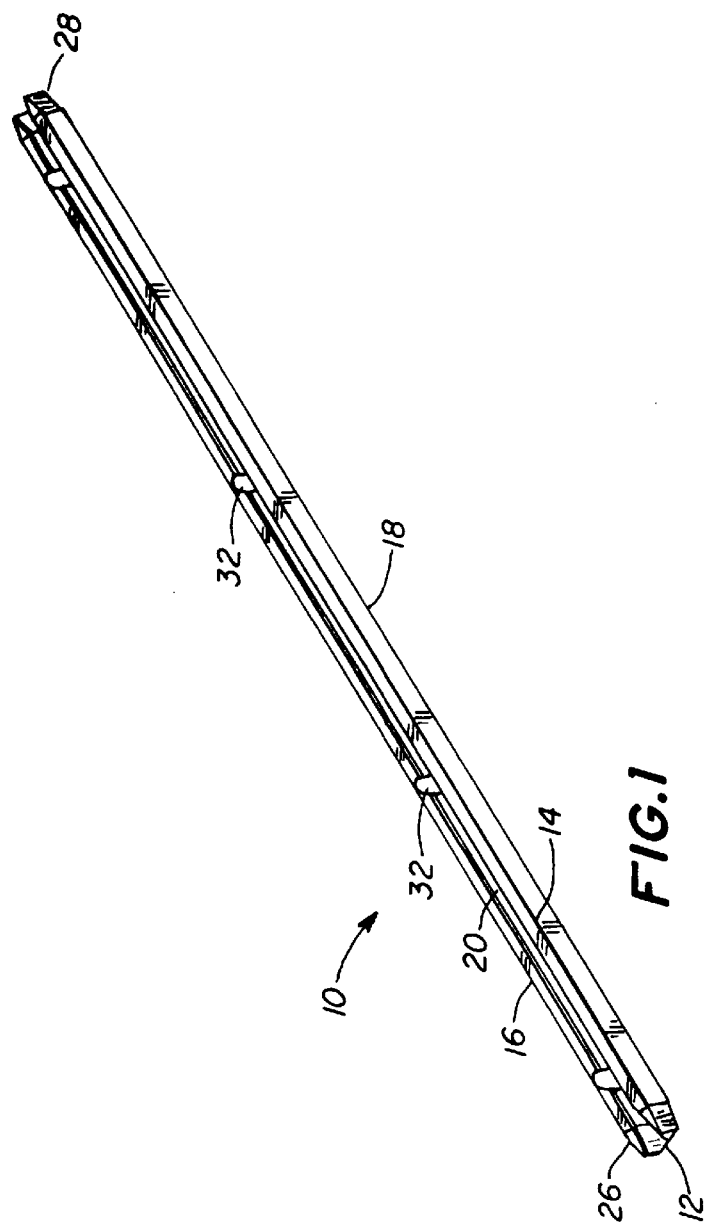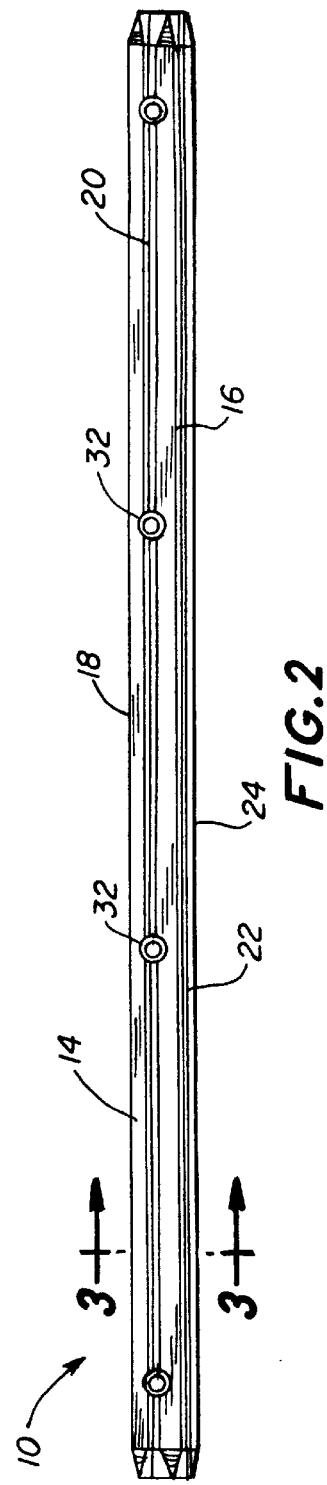

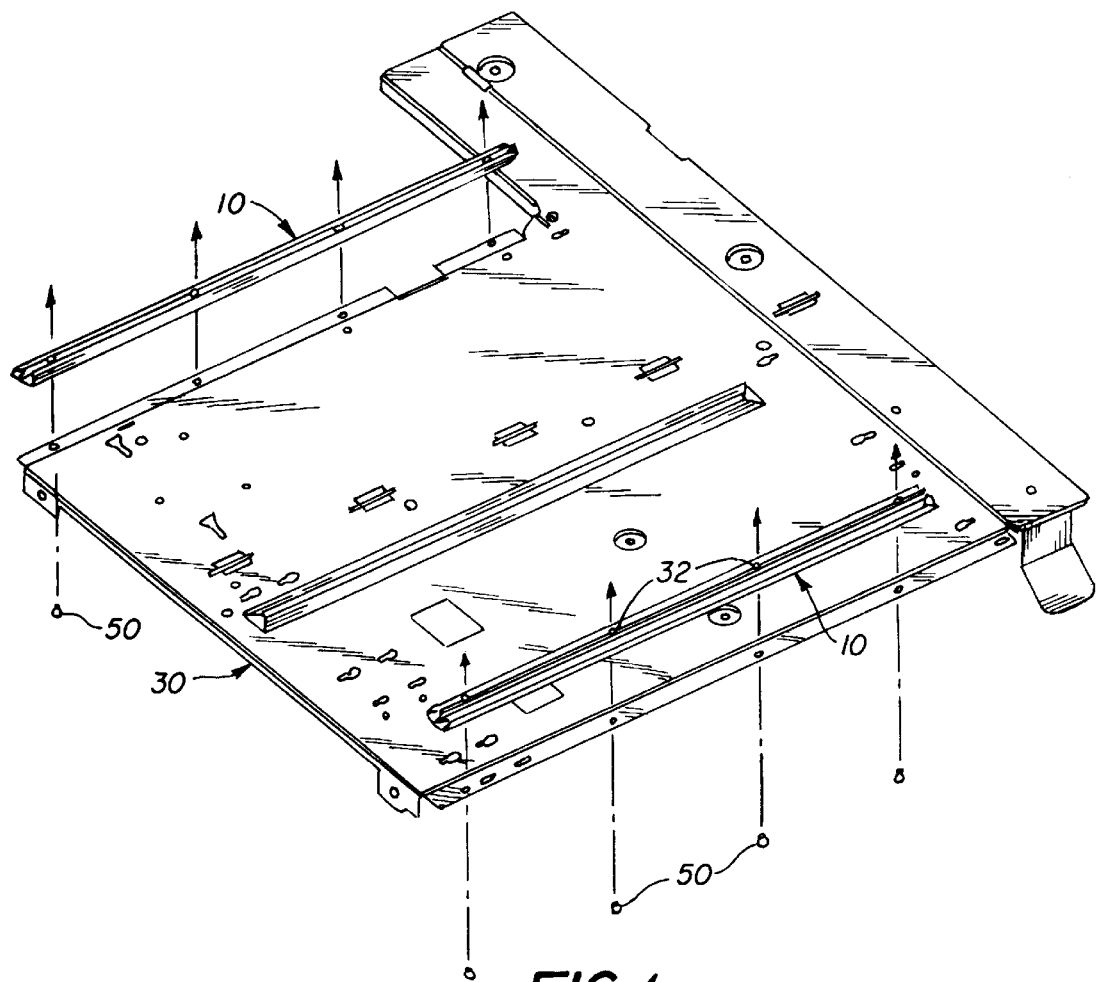
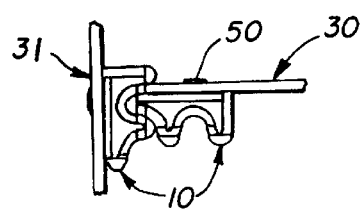
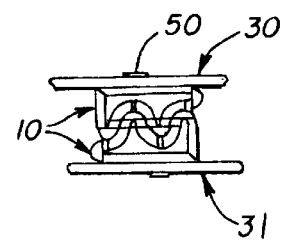
FIG.4
FIG.5
FIG.6

GUIDE RAIL HAVING SIMILARLY SIZED RIBS AND SHOULDER

FIELD OF INVENTION

This invention relates generally to guide rails for slidably guiding two components in relation to one another and more specifically to a guide rail for removable assemblies in electronic devices.

BACKGROUND

Various kinds of guide rails have been developed and are being used in applications where it is desirable to have two components slidably mounted together. For example, guide rails are commonly used in relatively large or complex electronic devices to secure various component subassemblies or subsystems to the main chassis. Mounting such component subassemblies to the main chassis by a guide rail system allows such component subassemblies to be slidably removed from the main chassis for service or replacement.

Most guide rails of the type used in such electronic devices typically comprise a pair of metal or plastic rails that are secured to the chassis. If the guide rails are for mounting a printed circuit board (PCB) or the like, each guide rail may include a groove or slot designed to receive the edge of the printed circuit board (PCB). The PCB may then be secured to the chassis by aligning the edges of the board with the groove or slot in the respective guide rail, and then sliding the board home. Alternatively, the guide rails installed on the chassis may be designed to receive a mating guide rail that will be attached to the component subassembly.

Regardless of the type of guide rail mounting system used, such guide rails are not without their problems. For example, if the guide rails are designed to slidably receive the edges of a PCB, it is common to fabricate the guide rails from a material that will provide for a low friction fit with the particular circuit board that is to be used. Unfortunately, problems may develop if the circuit board is later replaced with one constructed from a different material. Other problems may arise if the replacement board has a different thickness from that of the original board. On the other hand, if the guide rail system is of the type that is designed to be used with mating guide rails, then two different guide rail configurations are required: one configuration (e.g., "female") for the chassis and another configuration (e.g., "male") for the removable component.

Another problem associated with guide rail assemblies of the type described above is that it is often difficult and tedious to align the removable component with the guide rails. Further, once the removable component is aligned with the guide rails, the coefficient of friction between the guide rails may be such that it is difficult to slide the removable component to the home position.

consequently, a need exists for an improved guide rail system that will readily accommodate different types of component subassemblies. Ideally, such a guide rail assembly should allow for a consistent, low friction fit with improved ease of alignment. Additional advantages could be realized if such a guide rail assembly would provide for parallel, as well as perpendicular, alignment of the removable component with the chassis.

SUMMARY OF THE INVENTION

A guide rail may comprise a pair of ribs and a shoulder projecting outwardly therefrom, the shoulder terminating in a tip section, the pair of ribs being positioned in substantially parallel, spaced-apart relation so that a channel is defined between the ribs and so that the shoulder is positioned adjacent one of the ribs. Each rib has a substantially identical height and thickness. The channel has a width about equal to the thickness of the ribs and a depth about equal to the height of the ribs. The shoulder has a height about equal to the height of the ribs and a thickness about equal to the thickness of the ribs.

BRIEF DESCRIPTION OF THE DRAWING

Illustrative and presently preferred embodiments of the invention are shown in the accompanying drawing in which:

FIG. 1 is a perspective view of a guide rail according to the present invention;

FIG. 2 is a top view of the guide rail showing the arrangement and relative spacing between the two ribs and the shoulder;

FIG. 4 is a perspective view of a removable tray and showing the mounting of the guide rails thereto;

FIG. 5 is a side view in elevation showing how the guide rails may be slidably engaged to allow a perpendicular alignment between a chassis and the removable tray; and FIG. 6 is a side view in elevation showing how the guide rails may be slidably engaged to allow a parallel alignment between the chassis and the removable tray.

Detailed Description of the Invention

Figure 3:
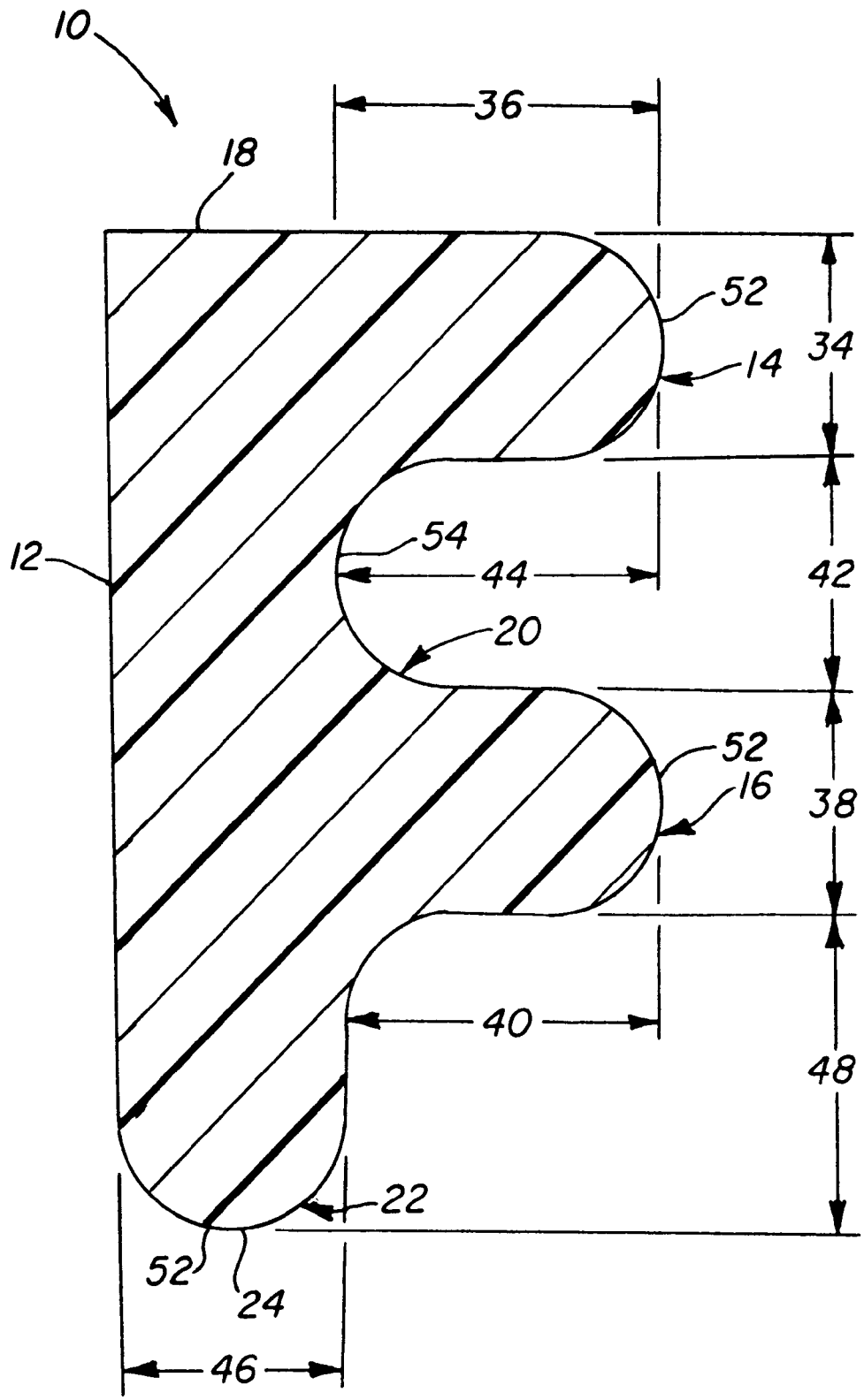
FIG. 3 is a cross-section view in elevation of the guide rail taken along the line 3-3 of FIG. 2.

A guide rail 10 according to the present invention is best seen in FIGS. 1 and 2 and may comprise an elongate base portion 12, a first rib 14, and a second rib 16. The first and second ribs 14 and 16 are positioned on the elongate base portion 12 so that the first rib 14 forms an elongate first side 18 of the guide rail 10 and so that a channel 20 is defined between the first rib 14 and the second rib 16. A shoulder 22 forms an elongate second side 24 of the guide rail 10, as best seen in FIG. 2. To facilitate lead-in alignment, the first and second ribs 14 and 16 may be tapered at each end 26, 28 of guide rail 10, as best seen in FIG. 1. To facilitate mounting to a chassis member 31 (FIGS. 5 and 6) and to a removable tray 30 (FIG. 4), the guide rail 10 may also include a plurality of holes 32. In cross-section, the shape of the guide rail 10 is comparable to that of the letter 'F', in which each rib 14 and 16 corresponds to a "leg"of the letter 'F' and the shoulder 22 corresponds to the "tail"of the letter. See FIG. 3.

As will be described in greater detail below, the configuration of the guide rail 10 is such that a second identical guide rail 10 can be slidably received by the first guide rail to mount a removable component, such as a tray 30 to a chassis member 31 in either a perpendicular or right angle arrangement, as shown in FIG. 5, or in a parallel arrangement, as shown in FIG. 6.

In one preferred embodiment, the guide rail 10 comprises a single piece and is molded from a polycarbonate plastic to which a small amount of polytetrafluoroethylene (PTFE) has been added. The PTFE acts as a lubricant, reducing the coefficient of friction of the guide rail 10 and providing for an exceptionally smooth sliding fit between the two adjacent rails.

A significant advantage of the present invention is that a single guide rail configuration can serve both as the guiding rail and as the guided rail. Consequently, the present invention does away with the need for two different guide rail configurations to form a mating pair. Another advantage of the present invention is that the two guide rails 10 can be slidably engaged with one another in either a perpendicular or right angle arrangement (FIG. 5) or in a parallel arrangement (FIG. 6). Therefore, the guide rail 10 according to the present invention allows for either the perpendicular or parallel mounting of the sliding component with respect to the chassis, again without the need for separate guide rail configurations. Still another advantage of the guide rail 10 is that the tapered ends 26 and 28 provide a generous lead-in, thus greatly easing the task of aligning the guide rails for sliding engagement. The coefficient of sliding friction between the guide rails is reduced by the addition of a lubricant, such as PTFE, to the plastic composition comprising the guide rail 10.

Having briefly described the guide rail 10, as well as some if its more significant features and advantages, the guide rail 10 according to the present invention will now be described in detail. Referring back now to FIGS. 1–3 simultaneously, one preferred embodiment of a guide rail 10 according to the present invention may comprise an elongate base portion 12 formed so that it includes a first rib 14, a second rib 16, and a shoulder 22. The arrangement of the first and second ribs 14 and 16 is such that the first rib 14 forms the elongate first side 18 of the guide rail 10 and such that the two ribs 14, 16 together define a channel 20 therebetween. The shoulder 22 forms the elongate second side 24 of guide rail 10. Guide rail 10 may also include a plurality of holes 32 to allow it to be attached to a chassis member 31 (FIG. 5) or to a removable component, such as a tray 30 (FIG. 4).

As was mentioned above, the cross section of the guide rail 10 is comparable to that of a letter 'F', as best seen in FIG. 3. Accordingly, each rib 14, 16 corresponds to one of the horizontal "legs"of the letter 'F', whereas the shoulder 22 corresponds to the vertical "tail"of the letter 'F'. In one preferred embodiment, rib 14 has a thickness 34 and a height 36 which are about equal to the thickness 38 and height 40 of rib 16, respectively. In order to allow two identical guide rails 10 to slidably receive each other in a parallel orientation (FIG. 6), the width 42 of channel 20 is made so that it is about equal to the thickness 34, 38 of each respective rib 14, 16. Similarly, the depth 44 of the channel 20 should be about equal to the height 36, 40 of each respective rib 14, 16.

In order to allow two identical guide rails 10 to slidably receive each other in a perpendicular orientation (FIG. 5), the thickness 46 of the shoulder 22 should be about equal to the thickness 34, 38 of the respective ribs 14, 16 (i.e., the width 42 of the channel 20). Likewise, the height 48 of the shoulder 22 should be about equal to the height 36, 40 of the respective ribs 14, 16 (i.e., the depth 44 of the channel 20).

In one preferred embodiment, the tip portions 52 of the ribs 14, 16 and shoulder 22 are rounded and form a substantially semi-circular cross-section, as best seen in FIG. 3. The bottom 54 of the channel 20 is also semi-circular so that it can receive either the tip 52 of the shoulder 22 or the tips 52 of the ribs 14 and 16, as best seen in FIGS. 5 and 6. However, the tips 52 of the rails 14, 16 and the tip 52 of the shoulder 22 need not be rounded, and could comprise any of a wide variety of shapes, so long as the shapes are such so as to allow for the sliding engagement of two identical guide rails 10. Consequently, the present invention should not be regarded as limited to a guide rail wherein the ribs 14, 16 and shoulder 22 have rounded tip portions 52.

The particular dimensions of an actual guide rail 10 will, of course, depend on the particular application. Similarly, the exact thicknesses, heights, depths, etc., of the ribs 14, 16, channel 20, and shoulder 22, should be such so as to allow for a sliding fit between the various mating members when two guide rails are positioned in either the perpendicular or parallel arrangements shown in FIGS. 5 and 6, respectively. The particular clearances between the various mating members will, of course, depend on the desired "closeness"of the sliding fit, the degree of smoothness of sliding desired, and on the particular material used to fabricate the rails. In one preferred embodiment, however, the dimensions of the ribs 14, 16, channel 20, and shoulder 22 are such that a clearance of about 0.05 mm is maintained between mating members of adjacent guide rails 10.

Referring now to FIGS. 1 and 2, it is preferred, but not required, that the ribs 14, 16 be tapered at each end 26, 28 of the guide rail 10 to allow for easier alignment between two guide rails 10. In addition, the height 36, 40 of the respective ribs 14, 16 and the thickness 46 of the shoulder 22 also may be tapered at each end 26, 28, as best seen in FIG. 1.

In one preferred embodiment, the guide rail 10 may be molded as a single piece from any of a wide variety of polycarbonate plastics, although other materials could also be used. It is preferred, but not required, that a lubricant be added to the plastic to reduce the coefficient of friction of the guide rail 10. Consequently, in one preferred embodiment, about 10 (by weight) of PTFE is added to the polycarbonate plastic as a lubricant, although more or less PTFE could be added.

Referring now to FIGS. 4–6, two identical guide rails 10 may be mounted to a removable tray 30 by any convenient means, such as by a plurality of rivets 50 sized to engage the holes 32 in the guide rails 10. Alternatively, screws or any other type of fastening device may be used to secure the rails to the tray 30, such as flat head rivets. The guide rails 10 may then be slidably engaged with identical guide rails 10 attached to a chassis member 31 to retain the removable tray 30 in a perpendicular orientation with respect to the chassis member 31, as shown in FIG. 5. Alternatively, the guide rails 10 may retain the removable tray 30 to the chassis member 31 in a parallel orientation, as shown in FIG. 6.

It is contemplated that the inventive concepts herein described may be variously otherwise embodied and it is intended that the appended claims be construed to include alternative embodiments of the invention except insofar as limited by the prior art.

What is claimed is:

1. A guide rail comprising an elongate base having a pair of ribs and a shoulder projecting outwardly therefrom, said shoulder terminating in a tip section, each of said pair of ribs having a substantially identical height and thickness, said pair of ribs being positioned in substantially parallel, spaced-apart relation so that a channel is defined therebetween and so that said shoulder is positioned adjacent one of said pair of ribs, wherein said channel has a width about equal to the thickness of said ribs and a depth about equal to the height of said ribs, and wherein said shoulder has a height about equal to the height of said ribs and a thickness about equal to the thickness of said ribs.

2. The guide rail of claim 1, wherein the thickness of each of the pair of ribs is tapered at each end of said guide rail.

3. The guide rail of claim 2, wherein the height of each pair of ribs is tapered at each end of said guide rail.

4. The guide rail of claim 3, wherein the thickness of the shoulder is tapered at each end of said guide rail.

5. The guide rail of claim 4, wherein the width of the shoulder is tapered at each end of said guide rail.

6. The guide rail of claim 1, wherein the guide rail comprises a polycarbonate material.

7. The guide rail of claim 6, wherein said polycarbonate material includes a lubricant.

8. The guide rail of claim 7, wherein said lubricant comprises PTFE.

9. The guide rail of claim 1, wherein each of said pair of ribs has a rounded tip portion.

10. A guide rail having a pair of ribs each of which has a substantially identical height and thickness and which is positioned in substantially parallel, spaced-apart relation so that a channel is defined therebetween, said guide rail further comprising a shoulder positioned adjacent one of said pair of ribs, said shoulder terminating in a tip section, wherein said channel has a width about equal to the thickness of said ribs and a depth about equal to the height of said ribs, and wherein said shoulder has a height about equal to the height of said ribs and a thickness about equal to the thickness of said ribs.

11. The guide rail of claim 10, wherein the guide rail comprises a polycarbonate material.

12. The guide rail of claim 11, wherein said polycarbonate material includes a lubricant.

13. The guide rail of claim 12, wherein said lubricant comprises PTFE.

14. The guide rail of claim 10, wherein each of said pair of ribs has a rounded tip portion.

15. A guide rail having an 'F'-shaped cross-section such that a distance between each leg of the 'F' is about equal to a width of a tail of the 'F', the tail of the 'F' terminating in a tip section, wherein two of said guide rails can be positioned together in sliding relation so that the tail of one of said guide rails is slidably received between each of the legs of the other of said guide rails and so that one of the legs of one of said guide rails is slidably received between each of the legs of the other of said guide rails.

16. The guide rail of claim 15, wherein the guide rail comprises a polycarbonate material.

17. The guide rail of claim 16, wherein said polycarbonate material includes a lubricant.

18. The guide rail of claim 17, wherein said lubricant comprises PTFE.

19. The guide rail of claim 15, wherein each of said pair of legs has a rounded tip portion.

* * * * *

UNITED STATES PATENT AND TRADEMARK OFFICE
CERTIFICATE OF CORRECTION

PATENT NO.   : 5,938,050
DATED        : August 17, 1999
INVENTOR(S)  : Arlen L. Roesner It is certified that error appears in the above-identified patent and that said Letters Patent is hereby corrected as shown below:

Column 1,
Line 55, delete "consequently" and insert therefor -- Consequently --

Column 4,
Line 14, delete "10" and insert therefor -- 10% --

Signed and Sealed this

Fourth Day of June, 2002

Attest:

Attesting Officer

JAMES E. ROGAN
Director of the United States Patent and Trademark Office